(12) United States Patent
Dally et al.

(10) Patent No.: US 7,216,214 B2
(45) Date of Patent: *May 8, 2007

(54) SYSTEM AND METHOD FOR RE-ORDERING MEMORY REFERENCES FOR ACCESS TO MEMORY

(75) Inventors: William J. Dally, Stanford, CA (US); Scott W. Rixner, Mountain View, CA (US)

(73) Assignees: The Massachusetts Institute of Technology, Cambridge, MA (US); The Board of Trustees of the Leland Stanford Junior University, Pala Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/434,392

(22) Filed: May 15, 2006

(65) Prior Publication Data

US 2006/0215481 A1  Sep. 28, 2006

Related U.S. Application Data

(63) Continuation of application No. 11/019,979, filed on Dec. 21, 2004, now Pat. No. 7,047,391, which is a continuation of application No. 09/394,222, filed on Sep. 13, 1999, now abandoned.

(60) Provisional application No. 60/100,147, filed on Sep. 14, 1998.

(51) Int. Cl.
*G06F 12/00* (2006.01)

(52) U.S. Cl. .................... 711/217; 711/105; 711/158; 365/230.01

(58) Field of Classification Search ........... 365/230.03, 365/230.01, 189.05; 711/217, 105, 158
See application file for complete search history.

(56) References Cited

U.S. PATENT DOCUMENTS

| | | | |
|---|---|---|---|
| 6,157,987 A * | 12/2000 | Krishnamurthy et al. ... | 711/129 |
| 6,288,730 B1 * | 9/2001 | Duluk et al. ................. | 345/552 |
| 6,289,470 B1 * | 9/2001 | Tanaka ......................... | 714/5 |
| 6,298,424 B1 * | 10/2001 | Lewchuk et al. ........... | 711/158 |

FOREIGN PATENT DOCUMENTS

JP  5863283  * 4/1983

* cited by examiner

*Primary Examiner*—Jack A. Lane
(74) *Attorney, Agent, or Firm*—Crawford Maunu PLLC

(57) ABSTRACT

A memory processing approach involves implementation of memory status-driven access. According to an example embodiment, addresses received at an address buffer are processed for access to a memory relative to an active location in the memory. Addresses corresponding to an active location in the memory array are processed prior to addresses that do not correspond to an active location. Data is read from the memory to a read buffer and ordered in a manner commensurate with the order of received addresses at the address buffer (e.g., thus facilitating access to the memory in an order different from that received at the address buffer while maintaining the order from the read buffer).

22 Claims, 2 Drawing Sheets

SYSTEM AND METHOD FOR RE-ORDERING MEMORY REFERENCES FOR ACCESS TO MEMORY

RELATED PATENT DOCUMENTS

This application is a continuation of U.S. patent application Ser. No. 11/019,979 filed on Dec. 21, 2004, to issue as U.S. Pat. No. 7,047,391 on May 16, 2006 to which priority is claimed under 35 U.S.C. § 120. U.S. patent application Ser. No. 11/019,979 is further a continuation of U.S. patent application Ser. No. 09/394,222 filed on Sep. 13, 1999 (now abandoned), which claimed benefit under 35 U.S.C. § 119(e) to U.S. Provisional Patent Application No. 60/100,147 filed on Sep. 14, 1998.

FEDERALLY-SPONSORED RESEARCH AND DEVELOPMENT

This invention was made with Government Support under contract DABT63-96-C-0037 awarded by the Department of the Army. The U.S. Government has certain rights in this invention.

FIELD OF THE INVENTION

The present invention relates to a memory control and, more particularly, a memory control system that facilitates access to memory cells.

BACKGROUND

Modern computer systems use dynamic memory chips that are arranged as a matrix of rows and columns. FIGS. 1–3 illustrate examples of such dynamic memory chips. FIG. 1 shows various memory cells disbursed within different banks 1–8. FIG. 2 illustrates certain of the components within a given bank of memory. Associated with the bank is a row decoder 22, a column decoder 24, a memory array 26, a sense amplifier 28 and column selection circuitry 30, also referred to herein circuitry 110.

A portion of the memory array 26 is further illustrated in FIG. 3 with a plurality of memory cells 30 attached to particular rows 32, (e.g., word lines) and columns 34 (e.g., bitlines).

Operation of memories as described above typically involves an address input to the memory array, with a memory cell associated with the input address being accessed and the data stored in that memory cell being read out. Similarly, if data needs to be written into the memory array, the data will have an associated address, and that address will be used to store the data into the memory cell associated with that particular address.

Memory chips as described above also use techniques in order to increase their speed and efficiency. Using conventional techniques, such chips can access a word of data in a different column of a pre-selected row in a very efficient manner (typically one word per cycle) but access to a word in a different (non-selected) row is relatively slow (typically ten cycles). Furthermore, since these chips are divided into banks as mentioned previously, which each include separate row/column matrices, as illustrated in FIG. 3, this allows for a row access to be performed on one bank while column accesses are being made to a different bank. While such operation improves efficiency somewhat, improvements are still needed.

Particularly, conventional memory systems process memory operations in the order they are received. If the memory system receives addresses in the same row as the previous address, it performs a column access. If an address in the same row as the previous address is not received, the memory system performs a row access. While this mode of operation yields adequate performance for access patterns with significant spatial locality, performance is degraded by almost 90% for unstructured address streams. Such unstructured address streams are typically of indirect vector or stream references.

These and other challenges to memory system operation and access have hindered certain aspects of memory and memory-related functions.

SUMMARY

The present invention is directed to overcoming the challenges associated with the above discussion and others related to the types of devices and applications discussed above and in other applications. These and other aspects of the present invention are exemplified in a number of illustrated implementations and applications, some of which are shown in the figures and characterized in the claims section that follows.

In an example embodiment of the present invention, memory performance for access to unstructured address streams is facilitated.

In another example embodiment of the present invention, memory access operations are effected in an order that is different from the order that such memory access operations are requested. For instance, when memory operation requests are received in a particular order, the storage of and subsequent access to data is carried out in a manner that facilitates rapid memory access.

According to another example embodiment of the present invention, a memory system control circuit is adapted to select, from a set of pending memory references in an address buffer, a memory reference to present to a memory array as a function of an active location in the memory array. In one application, pending memory references in the address buffer that correspond to an active location in the memory array are processed before other memory references in the address buffer are processed. A read buffer is configured and arranged to provide data, from the memory array, in an order that is commensurate with the order in which memory references corresponding to the location of the data in the memory array, were received at the address buffer.

According to another example embodiment of the present invention, a memory system includes an address buffer, a read buffer, a memory array and a controller adapted to control the buffers and the memory array to store and retrieve data. When the memory system receives addresses (e.g., provided by a computer system) corresponding to data in an order, the addresses are queued in the address buffer. The control circuit presents addresses to the memory array in an order that is different than the order in which the addresses were received at the address buffer. The read buffer receives data read out from the memory array and presents the data for use (e.g., by the computer system) in the order in which the address buffer received addresses that correspond to the data.

The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

Figure 1:
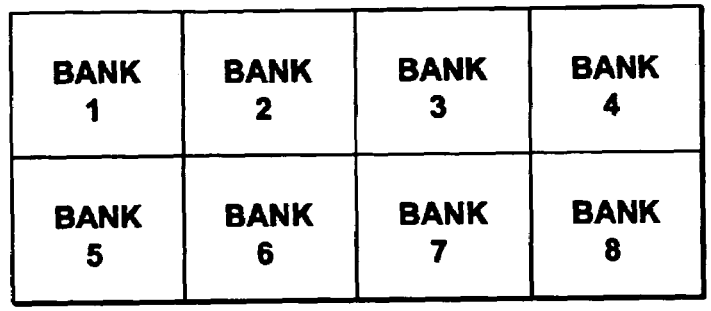
FIG. 1 illustrates a memory arrangement that may be implemented in connection with one or more example embodiments herein.
Figure 2:
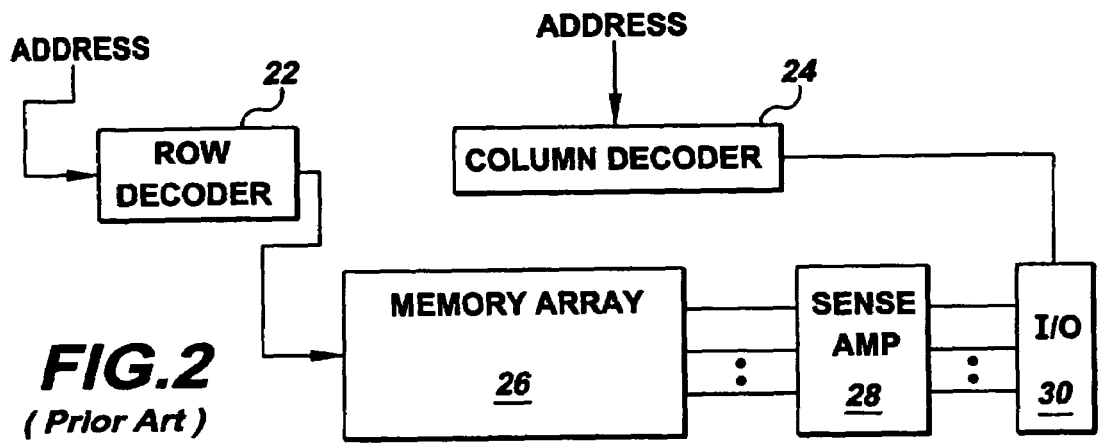
FIG. 2 illustrates a conventional dynamic random access memory arrangements that may be implemented in connection with one or more example embodiments herein.
Figure 3:
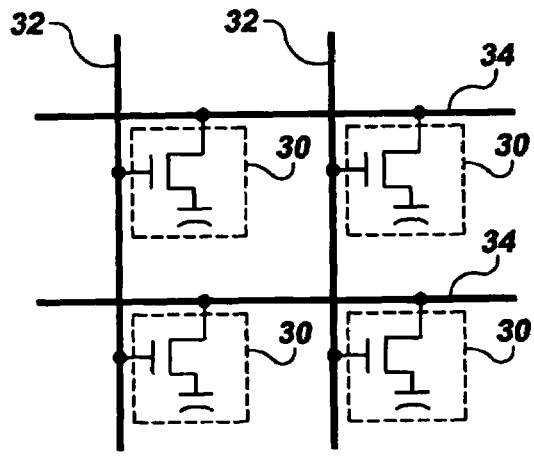
FIG. 3 illustrates a conventional dynamic random access memory arrangements that may be implemented in connection with one or more example embodiments herein.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of devices and processes, and has been found to be particularly suited for the management of memory access (read and/or write) with a memory array. While the present invention is not necessarily limited to such applications, various aspects of the invention may be appreciated through a discussion of examples using this context.

Figure 4:
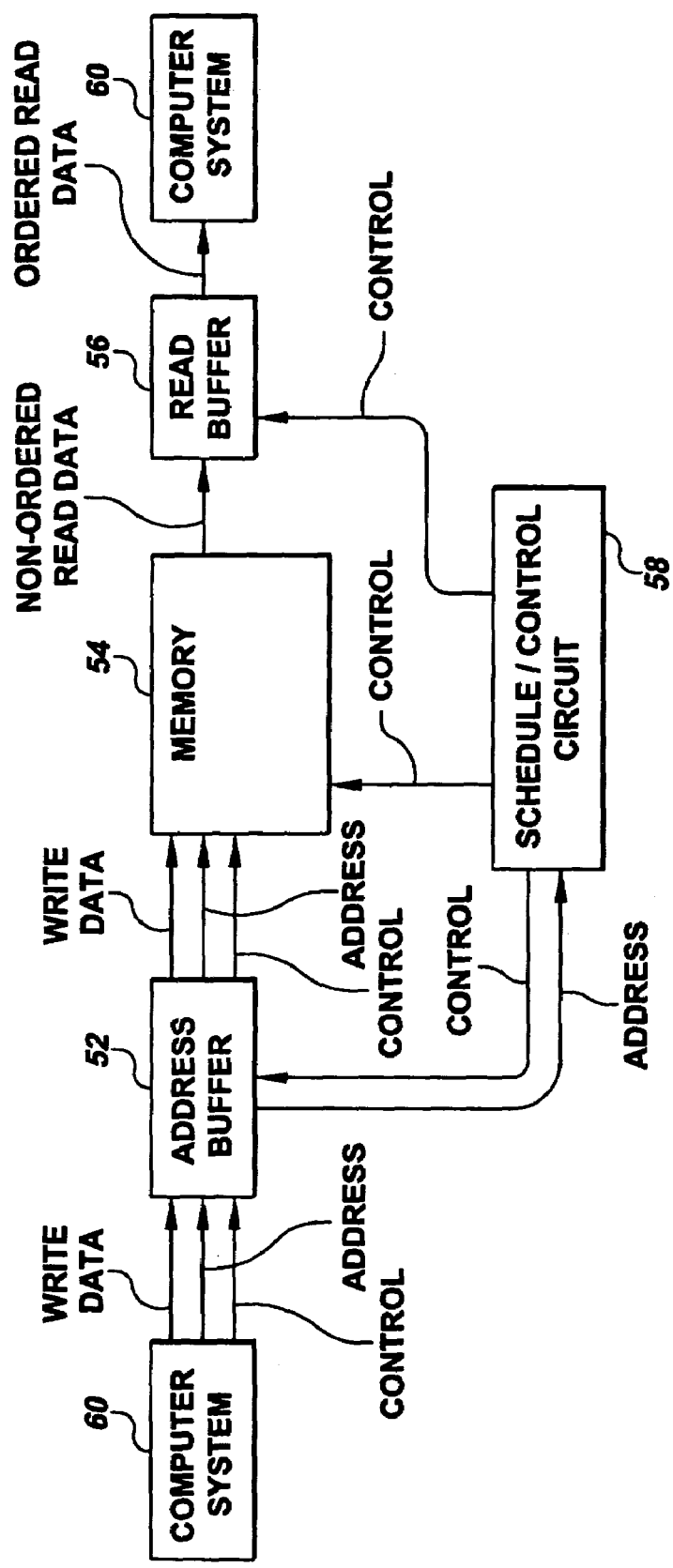
FIG. 4 illustrates a memory arrangement, according to an example embodiment of the present invention.

FIG. 4 illustrates a streaming memory system, according to an example embodiment of the present invention. The system includes an address buffer 52, memory 54, a read buffer 56 and a schedule/control circuit 58, with applications of each described in further detail hereinafter. While memory 54 is shown implemented as a discrete semiconductor circuit chip, the streaming memory system is implemented on a single integrated chip and/or in a variety of fashions, depending upon the particular application.

The address buffer 52 inputs addresses that will be used with the memory 54 to access certain particular memory cells during read or write operations. The address buffer 52 is implemented having storage capabilities that are large enough to handle a particular implementation (and corresponding memory buffer requirements). In this regard, the address buffer 52 is generally large enough to store addresses for a predetermined number of memory accesses that have been provided by a computer system 60 (or other processing arrangement or system).

The address buffer 52 receives and queues a number of addresses, which are operated upon in an order that is relative to an efficiency characteristic of access to the memory 54 and may, for example, involve operating upon these addresses in an order different from that received by the address buffer 52. The schedule/control unit 58 acts upon the addresses in the address buffer 52 as a function of characteristics of the memory 54. For instance, where an address in the address buffer 52 corresponds to an active portion of the memory 54, that address may be implemented with storing the data in the memory, in a manner independent from an order in which addresses are received in the address buffer 52. This approach facilitates the efficient use of access to the memory 54, with other addresses in the address buffer 52 being acted upon accordingly, relative to active portions of the memory 54 and/or the order in which the addresses are received.

The read buffer 56 stores the data that is read out from the memory device 54. This allows, therefore, the data that is read out to be stored and subsequently transmitted from the read buffer 56 to the computer system 60 in the same order as the order in which the addresses were received by the address buffer 52 from the computer system 60, for those addresses corresponding to read operations. That is, the order in which addresses are acted upon (e.g., and data read to) the memory 54 does not necessarily affect the order in which data is read out from the read buffer 56. Further, the order in which data is read out from the read buffer 56 can be correlated to the order in which addresses (corresponding to the data) are received at the address buffer 52.

The schedule/control circuit 58 controls the operation of re-ordering the addressing, as will now be further described in connection with a particular example application of the system shown in FIG. 4. It should be noted, however, that the operations that are conventionally required in order to access a memory device are not described in detail. In many applications, such conventional operations differ depending upon the type of memory device that exists, such as conventional dynamic random access memories, synchronous dynamic random access memories, or Rambus® dynamic random access memories, as well as other types of memories that are accessed as one or more banks of rows and columns.

On initiation of a new cycle, a new address is input to the address buffer 52. Addresses in the address buffer 52 are compared with the address of the active row in the previous cycle (e.g., using a comparator in the schedule/control circuit 58 that compares the row address of each address with the row address of the currently active row). If one or more of the addresses in the address buffer 52 correspond to an address associated with the active row from the previous cycle (also termed currently active row), the schedule/control circuit 58 initiates those control signals required to perform column addressing of the oldest (i.e., earliest received) address in the address buffer 52 that corresponds to the active row using a priority encoder that selects the first address entered into the address buffer that is contained in the currently active row. That oldest corresponding address, therefore, is operated upon during that cycle and is input into memory 54 so that the memory cell associated with that address can be accessed. Thus, the comparator (and, e.g., a priority encoder), implemented using, e.g., hardwired logic that make up the schedule/control circuit 58, operate every cycle in parallel to select an access to be run. Each cycle the logic scans the addresses in the address buffer 52 to find one (if any) that is to an active row and selects this address for a column access.

If a simultaneous row access is also possible, the logic in the schedule/control circuit 58 also scans the addresses to find one for which a row access would be profitable, one for which there are no more addresses to the active row in its bank and (optionally) for which there are several other addresses in the same row queued. Thus, for certain memory devices, while column addressing of an address is performed, the schedule/control circuit 58 can also initiate row addressing of a row in a bank other than the currently active row bank. For instance, if column addressing of an address associated with the active row is accessing data in bank 1, the schedule/control circuit 58 may initiate row addressing for a row within bank 6, since bank 6 does not currently contain an active row, such that in a subsequent cycle column addressing of that row can take place. With this approach, row access latency can be hidden under column accesses to other banks, thus improving efficiency of this system.

Once a row access is initiated, the schedule/control circuit 58 will also initiate subsequent control operations, depending on whether a read or a write operation was to take place.

If a write operation takes place, the associated data is written into the addressed memory cell location.

If a read operation takes place, the schedule/control circuit 58 causes the read out of data from the addressed memory cell location, and storage of that data into a read buffer 56. The data is then read out of the read buffer 56 in the order that the read addresses were initially received into the address buffer 52 (e.g., as discussed above). In one particular application, in a read operation, the read buffer 56 is indexed by a pair of pointers in a manner such as that used to reorder instructions in processors that allow out of order execution. As each read access is inserted into the address buffer 52, the next sequential location in the read buffer 56 is identified by a read-tail pointer, reserved for this access, and marked pending. The value of the read-tail pointer is queued with the address in the address buffer 52 to record the location assigned and the read-tail pointer is incremented modulo the size of the read buffer 56. When the queued read access is actually performed, the data read is inserted into the read buffer 56 location reserved for this access using the pointer queued with the address in the address buffer 52 and this location is marked full.

In another implementation, a read-head pointer is used to remove data from the read buffer 56. On reset the read-head and read-tail pointer both point to the same location and that location is marked empty. As read accesses arrive, the read-tail pointer is incremented by the schedule/control circuit 58 and locations are marked pending to allocate sequential read buffer 56 locations to these sequential accesses. Finally, as read accesses are performed, some of these pending locations are filled.

Whenever the location identified by the read-head pointer is marked full, the value in that location is output, the location marked empty, and the read-head pointer incremented modulo the size of the read buffer 56. Because the read-data for the accesses is output in the same order that the read addresses arrived, ordering, read order is preserved even though memory accesses are performed out of order. The read buffer 56 in effect reorders the out of order memory accesses.

On another embodiment, ordering is effected in connection with the completion of memory write operations out of order with operations that read or write other memory rows (not to be of the same address). The schedule/control circuit 58 always performs accesses in the same row in the original requested order, thus preserving the original order for two writes to the same location or a read and a write to a given location. The ordering of write operations and the relative ordering of reads and writes by always scanning for accesses to an active row are preserved in the order that accesses arrived. Thus, an 'older' access to a given row, and hence a given location, will always occur before a later access to the same row, and hence same location. Only accesses to distinct rows and hence distinct locations are reordered. Thus, read before write or write before read hazards are not a problem with the schedule/control circuit 58 re-ordering.

In another example embodiment of the present invention, the address buffer 52 and the read buffer 56 are partitioned so that addresses and data for each of separate banks are buffered separately. Thus, the schedule/control circuit 58 can access the partitioned buffer associated with a currently active bank and perform an equality comparison on a those address bits necessary to determine if another address in the partitioned buffer corresponds to the currently active row in the currently active bank. The schedule/control circuit 58 then further determines whether to perform fast column addressing for a currently active bank using the other address, or instead initiate addressing of another bank in the manner previously described. With the latter approach involving addressing of another bank, row addressing of another bank is performed while the fast column addressing of the bank that previously had an associated active row is ongoing.

The present invention also contemplates initiating access of multiple rows in different banks at the same time.

While the present invention has been described with reference to several particular example embodiments, those skilled in the art will recognize that many changes may be made thereto without departing from the spirit and scope of the present invention.

What is claimed is:

1. A computer arrangement that receives addresses corresponding to data in an order, the computer arrangement comprising:
    an address buffer that receives addresses in said order;
    a control circuit that selects, as a function of an active location in a memory and independent of any data previously provided with the addresses by the computer arrangement to convey the addresses priority and purpose, a memory reference corresponding to at least one of the received addresses, the memory reference being selected to access the memory in an order different than the order in which the addresses were received by the address buffer; and
    a read buffer that receives data read out from the memory.

2. A computer arrangement according to claim 1, wherein the memory is partitioned into a plurality of rows, and the selection of the memory reference is a function of a comparison of the currently active row and the row corresponding to the memory reference.

3. A computer arrangement according to claim 1, wherein the memory is partitioned into a plurality of banks, and the control circuit selects each address in the address buffer that corresponds to an active row of a given bank before selecting addresses that correspond to a different row of the given bank.

4. A computer arrangement according to claim 1, wherein the memory is partitioned into a plurality of banks, and the control circuit selects each address in the address buffer that corresponds to an active row of a first bank before selecting an address that correspond to a second bank.

5. A computer arrangement according to claim 1, wherein the memory is partitioned into a plurality of banks capable of having multiple simultaneously active rows and the control circuit selects an address corresponding to a second bank and an inactive row prior to an active row for a first bank becoming inactive.

6. A computer arrangement according to claim 1, wherein the memory is partitioned into a plurality of banks and the address buffer is partitioned into a separate address buffer for each bank.

7. A computer arrangement according to claim 6, wherein, the control circuit selection performs a comparison of a new address received at an address buffer partition for a bank to a currently active row for the bank.

8. A computer arrangement according to claim 7 wherein, the comparison of the new address to the address of the currently active row is performed prior to selecting another address.

9. A computer arrangement according to claim 1, wherein said control circuit comprises:
   a comparator that compares the row address of the addresses stored in the address buffer with the row address of a currently active row of said memory; and
   a priority encoder that selects the first address entered into the address buffer that corresponds to the currently active row of the memory.

10. A computer arrangement according to claim 9, wherein the control circuit is configured and arranged to present the selected first address to the currently active row of the memory, and wherein said priority encoder and the control circuit are respectively configured and arranged to reiteratively select the next address entered into the address buffer that corresponds to the currently active row of the memory and present the next address to the currently active row of the memory, until all of the addresses in the address buffer that correspond to the currently active row of the memory are presented to the memory.

11. A computer arrangement according to claim 1, further comprising:
   a head pointer and a tail pointer associated with the read buffer and adapted to track the order the addresses are received at the address buffer; and
   a buffer array containing a status flag for each received address currently stored in the address buffer.

12. For use by a computer arrangement, a system for accessing memory having a state of data accessibility subject to changing, the system comprising:
   means for receiving a plurality of memory access requests in a first order;
   means for buffering the plurality of memory access requests;
   means for initiating an out of order memory access request to a memory array for one of the plurality of memory access requests as a function of an active location in the memory array and independent of any prioritization data previously provided with the memory access requests by the computer arrangement to convey the addresses priority and purpose; and
   means for buffering memory data corresponding to the initiated memory access requests.

13. A system according to claim 12, wherein determining the order of the out of order memory access occurs as a function of the state of the memory before the received memory access requests are used to access the memory, and wherein the state of the memory is at least partly defined as a function of data-access speed for a segment of data stored in the memory.

14. A system according to claim 12, wherein the memory access request is initiated for each address in a currently active segment of the memory before the memory access request is initiated for addresses in an inactive segment of the memory.

15. A system according to claim 14, wherein the currently active segment is a row of the memory.

16. A system according to claim 15, wherein the memory is partitioned into a plurality of banks capable of multiple concurrent row accesses, and a row access is performed on a currently inactive row when another row is currently active.

17. A system according to claim 12, wherein buffering memory data includes setting a read tail pointer to identify a next sequential location in a buffer and setting a read head pointer to identify a next memory data for removal from the buffered memory data.

18. For use with a computer arrangement, a memory system that receives addresses corresponding to data, the memory system comprising:
   a first address buffer that receives addresses in a first order;
   a memory array;
   a second address buffer that receives data from the memory array;
   a control circuit that prioritizes the received addresses, as a function of an active location in the memory array, before the received addresses are used to access the memory array, that uses the received addresses to access the memory array in a second order that is different from the first order, and that provides the received data from the memory array in the first order.

19. The memory system of claim 18, wherein the second order is established to provide data access that is faster than would be provided by the first order.

20. The memory system of claim 18, wherein the control circuit is further adapted to establish the second order within the address buffer, and the address buffer is adapted to use the second order to access the memory array.

21. The memory system of claim 18, wherein the memory array has data with respective states of accessibility that change in response to accesses to the memory array, and wherein the control circuit is further adapted to prioritize the received addresses as a function of the state of the memory array before the received addresses are used to access the memory array.

22. The memory system of claim 18, wherein the memory array has data with respective states of accessibility that change in response to accesses to the memory array, and wherein the control circuit is further adapted to prioritize the received addresses as a function of the state of the memory array before the received addresses are used to access the memory array.

* * * * *